United States Patent
Lu et al.

(10) Patent No.: US 10,634,943 B2
(45) Date of Patent: Apr. 28, 2020

(54) DISPLAY SUBSTRATE AND MANUFACTURING METHOD THEREOF, DISPLAY PANEL AND DISPLAY DEVICE

(71) Applicant: Shanghai Tianma Micro-Electronics Co., Ltd., Shanghai (CN)

(72) Inventors: Feng Lu, Shanghai (CN); Koji Shigamura, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/919,489

(22) Filed: Mar. 13, 2018

(65) Prior Publication Data
US 2019/0025637 A1  Jan. 24, 2019

(30) Foreign Application Priority Data

Jul. 20, 2017  (CN) .......................... 2017 1 0595628

(51) Int. Cl.
*G02F 1/1335*  (2006.01)
*G02F 1/1362*  (2006.01)
(Continued)

(52) U.S. Cl.
CPC ...... *G02F 1/133514* (2013.01); *G02F 1/1368* (2013.01); *G02F 1/133512* (2013.01);
(Continued)

(58) Field of Classification Search
None
See application file for complete search history.

(56) References Cited

U.S. PATENT DOCUMENTS

2007/0285942 A1* 12/2007 Yang ................... H01L 27/3269
                                                          362/608
2011/0148834 A1*  6/2011 Baek ................... G09G 3/3406
                                                          345/207
(Continued)

FOREIGN PATENT DOCUMENTS

CN      102084232 A     6/2011
CN      103700706 A     4/2014
(Continued)

OTHER PUBLICATIONS

Japanese Office Action for corresponding Japanese Application Serial No. 2018-040428, dated Nov. 8, 2018, pp. 1-10.
Chinese Office Action dated Jul. 16, 2019 for corresponding CN Application No. 201710595628.4.
Chinese OA dated Mar. 4, 2020 for corresponding Chinese application No. 201710595628.4.

*Primary Examiner* — Khaja Ahmad
(74) *Attorney, Agent, or Firm* — Tarolli, Sundheim, Covell & Tummino LLP (57) ABSTRACT

The present disclosure provides a display substrate and a manufacturing method thereof, and a display panel. The display substrate has a display area and a peripheral area surrounding the display area, wherein a plurality of force sensors is provided in the peripheral area and the plurality of force sensors is made of polysilicon material, in a direction perpendicular to the display substrate, a first layer is provided directly under a layer where the plurality of force sensors is located, and a second layer is provided directly above the layer where the plurality of force sensors is located, a Young's modulus of at least one of the first layer and the second layer is larger than a Young's modulus of silicon oxide. The technical solution of the present disclosure can improve the detection accuracy of the force sensor with respect to a force.

15 Claims, 7 Drawing Sheets

(51) Int. Cl.
*G02F 1/1368* (2006.01)
*G06F 3/041* (2006.01)
*H01L 27/12* (2006.01)
*H01L 27/32* (2006.01)
*H01L 51/52* (2006.01)
*G02F 1/1333* (2006.01)

(52) U.S. Cl.
CPC ...... *G02F 1/136286* (2013.01); *G06F 3/0412* (2013.01); *G06F 3/0414* (2013.01); *G06F 3/0418* (2013.01); *H01L 27/124* (2013.01); *H01L 27/322* (2013.01); *H01L 27/3225* (2013.01); *H01L 51/5206* (2013.01); *G02F 1/13338* (2013.01); *G02F 2201/121* (2013.01); *G02F 2201/123* (2013.01); *G06F 2203/04103* (2013.01)

(56) References Cited

U.S. PATENT DOCUMENTS

2014/0353614 A1  12/2014  Park
2016/0043212 A1* 2/2016  Gao ................. H01L 27/1222
                                                257/71

FOREIGN PATENT DOCUMENTS

| CN | 105511679 A | 4/2016 |
| JP | 2004109862 A | 4/2004 |
| JP | 2011040726 A | 2/2011 |
| JP | 2012033506 A | 2/2012 |
| JP | 2012509605 A | 4/2012 |
| JP | 2013016777 A | 1/2013 |
| WO | 2012/160844 A1 | 11/2012 |

\* cited by examiner

DISPLAY SUBSTRATE AND MANUFACTURING METHOD THEREOF, DISPLAY PANEL AND DISPLAY DEVICE

CROSS-REFERENCE TO RELATED APPLICATIONS

The present application claims priority to Chinese Patent Application No. 201710595628.4, filed on Jul. 20, 2017, the content of which is incorporated herein by reference in its entirety.

TECHNICAL FIELD

The present disclosure relates to the field of display technologies and, in particular, to a display substrate, a manufacturing method thereof, and a display panel.

BACKGROUND

A display panel having a touch function is widely used in various display devices such as cellphones, tablet computers, information inquiry machines in public places and the like. A user can operate the display device by only touching an indicator on the display panel with a finger, which eliminates the user's reliance on other input devices (such as keyboards and mice), thereby simplifying human-computer interaction.

In order to meet the user's requirements better, a force sensor is usually provided in the display panel for detecting an amount of a force occurred when the user presses the display panel, so as to enable the display panel not only to collect touch position information, but also to collect force magnitude information, thereby broadening the application scope of touch technologies.

The structure of the display panel is complex and includes a plurality of layers. In the related art, a material of the layers, which are disposed directly above and under the layer where the force sensor is located, is silicon oxide. The Young's modulus thereof is relatively small. When an external force is applied, both elastic deformation and non-elastic deformation may occur, in which an inelastic deformation will remain in the layer and cannot be restored. Therefore, the force sensor still has a certain deformation even though at the position where the force sensor is located is not subjected to a stress, thereby leading to baseline drifting of the force sensor, which may deteriorate the detection accuracy of the force sensor with respect to the force.

SUMMARY

The present disclosure provides a display substrate, a manufacturing method of a display substrate, a display panel and a display device, so as to improve the detection accuracy of the force sensor with respect to a force.

In a first aspect, the present disclosure provides a display substrate. The display substrate has a display area and a peripheral area surrounding the display area, wherein a plurality of force sensors is provided in the peripheral area and the plurality of force sensors is made of polysilicon material, in a direction perpendicular to the display substrate, a first layer is provided directly under a layer where the plurality of force sensors is located, and a second layer is provided directly above the layer where the plurality of force sensors is located, a Young's modulus of at least one of the first layer and the second layer is larger than a Young's modulus of silicon oxide.

In a second aspect, the present disclosure provides a display panel including the above-mentioned display substrate.

In a third aspect, the present disclosure provides a method for manufacturing a display substrate, and the method includes steps of: dividing a substrate into a display area and a peripheral area surrounding the display area; forming a first layer in the peripheral area; forming a plurality of force sensors made of polysilicon material in the peripheral area upon the first layer, wherein the plurality of force sensors contacts with the first layer; and forming a second layer in the peripheral area upon the plurality of force sensors, wherein the second layer contacts with the plurality of force sensors; wherein a Young's modulus of at least one of the first layer and the second layer is larger than a Young's modulus of silicon oxide.

The present disclosure provides a display substrate and a manufacturing method thereof, and a display panel. The display substrate includes a display area and a peripheral area surrounding the display area. A plurality of force sensors is provided in the peripheral area, and the plurality of force sensors is made of polysilicon. In a direction perpendicular to the display substrate, a first layer is disposed directly under a layer where the force sensor is located, and a second layer is disposed directly above the layer where the force sensor is located. In the related art, a material of the layers, which are disposed directly above and under the layer where the force sensor is located, is silicon oxide. In an embodiment, Young's modulus of at least one of the first layer and the second layer is larger than Young's modulus of silicon oxide. As a result, compared with in the related art, at least one of the first layer and the second layer is more difficult to be compressed and will not easily cause a non-elastic deformation, so that the force sensor has no deformation when the position where the force sensor is located is not subject to a stress, which can effectively prevent the baseline of the force sensor from drifting, thereby improving detection accuracy of the force sensor with respect to the force.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. Obviously, the drawings described as follows are merely part of the embodiments of the present disclosure, other drawings can also be acquired by those skilled in the art without paying creative efforts.

DESCRIPTION OF EMBODIMENTS

In order to make the purpose, technical solutions, and advantages of the embodiments of the present disclosure to be clearer, the technical solutions in the embodiments of the present disclosure are clearly and completely described in the following with reference to the accompanying drawings in the embodiments of the present disclosure. Obviously, the described embodiments are merely exemplary embodiments of the present disclosure, which shall not be interpreted as limiting the present disclosure. All other embodiments obtained by those skilled in the art without creative efforts according to the embodiments of the present disclosure are within the scope of the present disclosure.

It should be noted that various features in the embodiments of the present disclosure may be combined with each other. The present disclosure will be described in detail as follows with reference to the accompanying drawings and embodiments.

Figure 1:
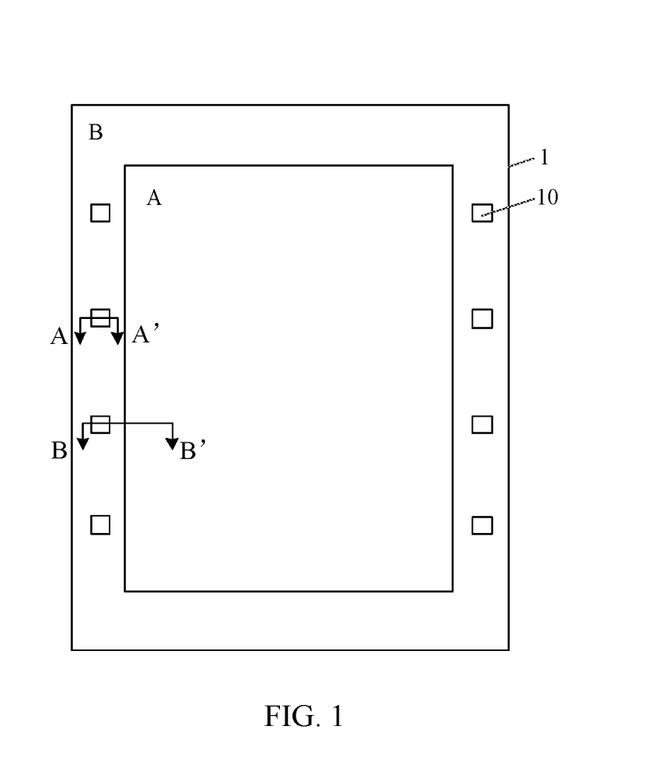
FIG. 1 is a top view of a display substrate provided by an embodiment of the present disclosure.
Figure 2:
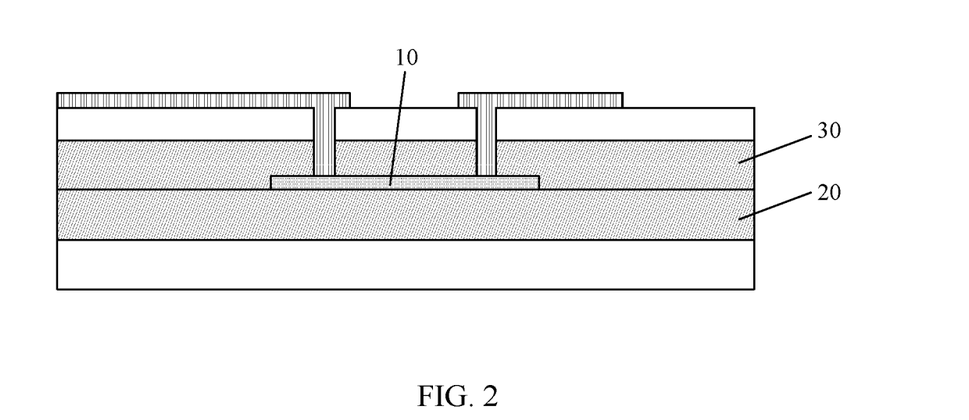
FIG. 2 is a cross-sectional view along direction A-A' in FIG. 1 provided by an embodiment of the present disclosure.

The present disclosure provides a display substrate, as shown in FIG. 1 and FIG. 2. FIG. 1 is a top view of a display substrate provided by an embodiment of the present disclosure, and FIG. 2 is a cross-sectional view along direction A-A' in FIG. 1 provided by an embodiment of the present disclosure. The display substrate 1 includes a display area A and a peripheral area B surrounding the display area A. A plurality of force sensors 10 is disposed in the peripheral area B. A material of the force sensors 10 is polysilicon. In a direction perpendicular to the display substrate 1, a first layer 20 is disposed directly under a layer where the force sensor 10 is located, and a second layer 30 is disposed directly above the layer where the force sensor 10 is located. Young's modulus of at least one of the first layer 20 and the second layer 30 is larger than Young's modulus (75 GPa) of silicon oxide ($SiO_2$). The above-mentioned "a first layer 20 is disposed directly under a layer where the force sensor 10 is located, and a second layer 30 is disposed directly above the layer where the force sensor 10 is located" means that, a lower surface of the layer where the force sensor 10 is located directly contacts with the first layer 20, and an upper surface of the layer where the force sensor 10 is located directly contacts with the second layer 30.

A principle of detecting a magnitude of force by the force sensor 10 is as follows: when a force is applied at a certain position on the display panel, the position where the force sensor 10 is located is subjected to a stress caused by the force. Under the action of this stress, the force sensor 10 is deformed and an electric resistance of the force sensor 10 changes, then an output value of the force sensor 10 changes, and then the magnitude of the force subjected by the display panel can be calculated via this change. When the force sensor 10 is subject to no stress, the output value of the force sensor 10 is a baseline of the force sensor 10. Therefore, the change of the output value of the force sensor 10 is a difference between the baseline and the output value when the force sensor 10 is subject to a stress. Thus, if the baseline of the force sensor 10 drifts, the calculated magnitude of the force will not be accurate when the force sensor 10 is subject to a stress, i.e., when the display panel is subject to a force, so the detection accuracy of the force sensor with respect to the force is not high. The main reason leading to the baseline drift of the force sensor 10 lies in that, the display substrate includes a plurality of layers that will be elastically and non-elastically deformed when being pressed, and a non-elastic deformation remains in the layers and thus a restoration cannot be achieved, so the force sensor 10 still has a certain deformation even without being subject to a stress.

Generally, the force sensor made of polysilicon is manufactured in the same layer as an active layer also made of polysilicon (the active layer is included in a thin film transistor in the display area). Since a contact interface between silicon oxide and polysilicon is fine, the polysilicon has a good semiconductor performance, the thin film transistor has a good electric performance, which can prevent a contact between hydrogen elements and polysilicon in other layers (such as a silicon nitride layer), thereby avoiding a negative impact of the hydrogen elements on the semiconductor property of the polysilicon. Therefore, usually a material of layers disposed directly above and under the active layer is silicon oxide, so a material of layers disposed directly above and under the layer where the force sensor is located is silicon oxide. However, Young's modulus of silicon oxide is relatively small, so that when an external force is applied, both elastic deformation and non-elastic deformation will occur. In this case, the non-elastic deformation remains in the layers and a restoration cannot be achieved, so the force sensor still has a certain deformation even when the position where the force sensor is located is not subject to a stress, resulting in that the baseline of the force sensor 10 drifts, and the detection accuracy of the force sensor with respect to the force is not high.

Figure 3:
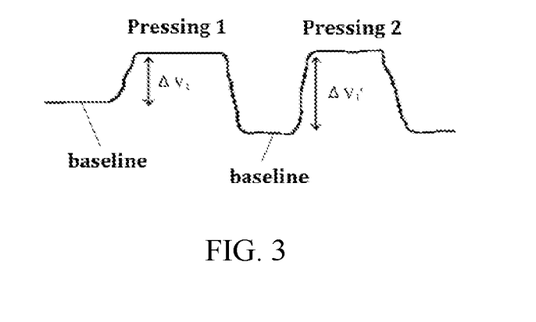
FIG. 3 is a schematic diagram of an output signal of the force sensor when the display panel is pressed twice using a same magnitude of force in the related art.

As shown in FIG. 3, FIG. 3 is a schematic diagram of an output signal of the force sensor when the display panel is pressed twice applying forces with the same magnitude in the related art. In the related art, when the display panel is pressed twice by using forces with the same magnitude (for example, 500 g), a difference between an output value of the force sensor and the baseline during the first pressing (indicated as pressing 1 in FIG. 3) is $\Delta V_1$, and the baseline of the force sensor drifts after the first pressing due to the accumulated stress in the various layers included in the display panel, as a result that, a difference between an output value of the force sensor and the baseline during the second pressing (indicated as pressing 2 in FIG. 3) is $\Delta V_1'$, which is significantly different from $\Delta V_1$, resulting in a low detection accuracy of the force sensor with respect to the force.

In an embodiment, Young's modulus of at least one of the first layer 20 and the second layer 30 is larger than Young's modulus of silicon oxide, as a result that, compared to the related art, at least one of the first layer 20 and the second layer 30 is more difficult to be compressed and will not easily cause a non-elastic deformation, so that the force sensor 10 has no deformation when the position where the force sensor 10 is located is not subject to a stress, which can effectively prevent the baseline of the force sensor 10 from drifting, thereby improving detection accuracy of the force sensor with respect to the force.

It should be noted that, there are three cases in which the Young's modulus of at least one of the first layer 20 and the second layer 30 is larger than the Young's modulus of silicon oxide. In a first case, only the first layer 20 has Young's modulus which is larger than the Young's modulus of silicon oxide. In a second case, only the second layer 30 has Young's modulus which is larger than the Young's modulus of silicon oxide. In a third case, the first layer 20 and the second layer 30 each have Young's modulus which is larger than the Young's modulus of silicon oxide. It is known from the above description that, usually a material of layers disposed directly above and under the active layer is silicon oxide, so a material of layers disposed directly above and under the layer where the force sensor is located is silicon oxide. Therefore in an embodiment, when only one of the first layer 20 and the second layer 30 selectively has Young's modulus which is larger than the Young's modulus of silicon oxide, a material of the other layer can be silicon oxide, which can prevent the baseline of the force sensor 10 from drifting, thereby improving detection accuracy of the force sensor. Further, when the first layer 20 and the second layer 30 each have Young's modulus which is larger than the Young's modulus of silicon oxide, both first layer 20 and the second layer 30 are difficult to be compressed, which can better prevent the baseline of the force sensor 10 from drifting, thereby better improving detection accuracy of the force sensor.

Any material having Young's modulus larger than the Young's modulus of silicon oxide is applicable in the present disclosure, for example, silicon nitride ($SiN_2$) and silicon oxynitride (SiON). On this basis, in an embodiment, when the first layer 20 and the second layer 30 each have Young's modulus which is larger than the Young's modulus of silicon oxide, the materials of the first layer 20 and the second layer 30 can be selected from various choices, for example, as a first choice, both the first layer 20 and the second layer 30 are made of silicon nitride; as a second choice, both the first layer 20 and the second layer 30 are made of silicon oxynitride; as a third choice, the first layer 20 is made of silicon nitride, and the second layer 30 is made of silicon oxynitride; as a fourth choice, the first layer 20 is made of silicon oxynitride, and the second layer 30 is made of silicon nitride. The inventor of the present disclosure has found through research that, the Young's modulus of silicon nitride is up to 220 GPa and the display substrate in the related art is provided with a silicon nitride layer. Therefore, in an embodiment of the present disclosure, selectively, at least one of the layer 20 and the second layer 30 is made of silicon nitride, or it is also possible that both the first layer 20 and the second layer 30 are made of silicon nitride.

Figure 4:
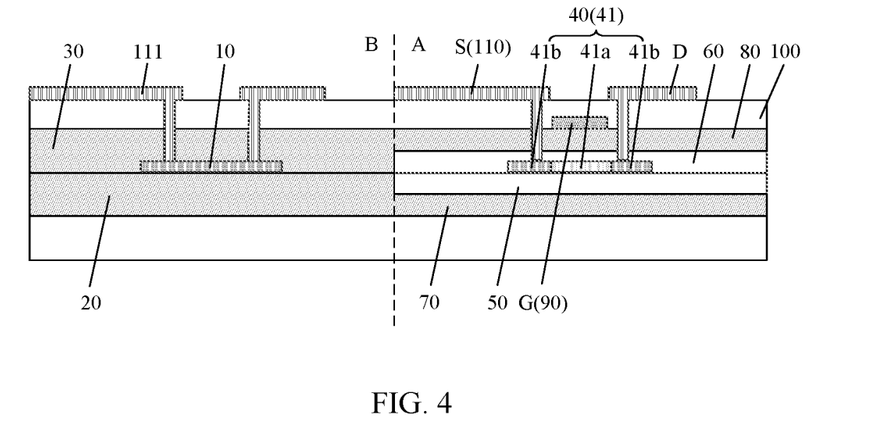
FIG. 4 is cross-sectional view I along direction B-B' in FIG. 1 provided by an embodiment of the present disclosure.
Figure 5:
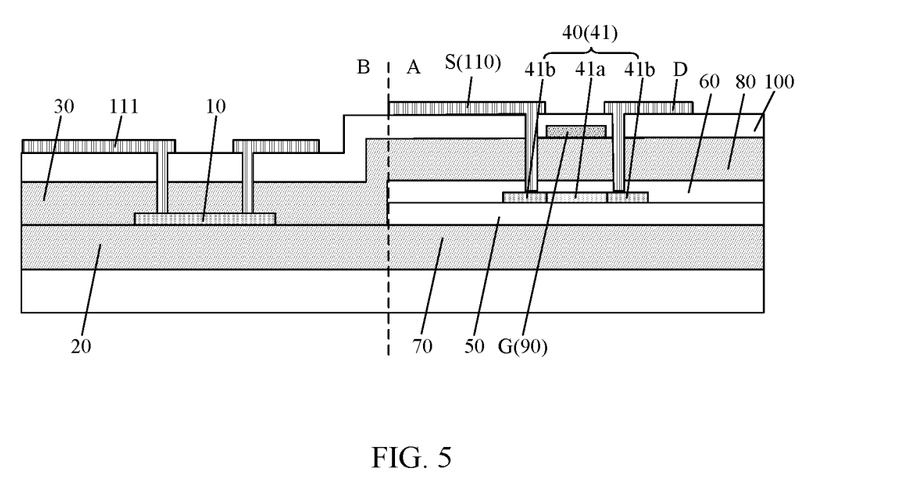
FIG. 5 is cross-sectional view II along direction B-B' in FIG. 1 provided by an embodiment of the present disclosure.

Optionally, in an embodiment, as shown in FIG. 4 and FIG. 5, FIG. 4 is a cross-sectional view I along direction B-B' in FIG. 1 provided by an embodiment of the present disclosure. FIG. 5 is a cross-sectional view II along direction B-B' in FIG. 1 provided by an embodiment of the present disclosure. A polysilicon layer 40, a first silicon oxide layer 50, a second silicon oxide layer 60, a first silicon nitride layer 70 and a second silicon nitride layer 80 are provided in the display area A. The first silicon nitride layer 70, the first silicon oxide layer 50, the polysilicon layer 40, the second silicon oxide layer 60, and the second silicon nitride layer 80 are sequentially disposed in a direction perpendicular to the display substrate. In order to simplify the manufacturing process of the display substrate 1 and reduce the cost, in an embodiment of the present disclosure, the layer where the force sensor 10 is located and the layer where the polysilicon layer 40 is located are arranged in the same one layer. The polysilicon layer 40 corresponds to the active layer of each thin film transistor in the display area A.

Both the first silicon oxide layer 50 and the second silicon oxide layer 60 are in direct contact with the polysilicon layer 40. Since a contact interface between the silicon oxide and the polysilicon layer 40 is fine, the polysilicon layer 40 has good semiconductor performance, the thin film transistors corresponding to the polysilicon layer 40 have good electric property, and can prevent hydrogen elements in the silicon nitride layer 70 and the second silicon nitride layer 80 from being in contact with the polysilicon layer 40, thereby avoiding a negative impact of the hydrogen elements on the semiconductor performance of the polysilicon layer 40.

As for the force sensor 10 in the present disclosure, the material of the force sensor 10 is also polysilicon, however in this case, not because of the semiconductor performance of the polysilicon, but because of the electrical conductivity of the polysilicon. Therefore, the layers directly disposed above and under the force sensor 10 made of silicon nitride will not affect its performance. In order to improve the performance of the force sensor 10, the electrical conductivity of its corresponding polysilicon may be improved. Therefore, the material of the force sensor 10 in an embodiment may be heavily doped polysilicon, wherein either N-type dopant or P-type dopant is available. Optionally, the surface doping concentration is $10^{10}/cm^2$ – $10^{15}/cm^2$, and thus the strain resistance of the force sensor 10 will not be excessively great, which is beneficial to transmission and detection of a signal and can effectively protect the lattice structure of the polysilicon from being destroyed.

Further, based on the above-mentioned layers provided in the display area A, the first layer 20 and the second layer 30 in an embodiment of the present disclosure can be arranged in the following two manners.

In a first manner, as shown in FIG. 4, the first layer 20 and the first silicon nitride layer 70 are arranged in the same one layer, and the total thickness of the first silicon nitride layer 70 and the first silicon oxide layer 50 is equal to the thickness of the first layer 20. The second layer 30 and the second silicon nitride layer 80 are arranged in the same one layer, and the total thickness of the second silicon nitride layer 80 and the second silicon oxide layer 60 is equal to the thickness of the second layer 30. In this case, the total thickness of the first layer 20 and the second layer 30 in the peripheral area B is equal to the total thickness of the first silicon oxide layer 50, the second silicon oxide layer 60, the first silicon nitride layer 70, and the second silicon nitride layer 80 in the display area A, so that the display substrate having the above-mentioned layers has a good flatness, which is beneficial to formation of subsequent other layers.

In a second manner, as shown in FIG. 5, the first layer 20 and the first silicon nitride layer 70 are arranged in the same one layer, and the thickness of the first layer 20 is equal to the thickness of the first silicon nitride layer 70. The second layer 30 and the second silicon nitride layer 80 are arranged in the same one layer, and the thickness of the second layer 30 is equal to the thickness of the second silicon nitride layer 80. In this case, the first layer 20 and the first silicon nitride layer 70 can be formed by only one patterning process, and the second layer 30 and second silicon nitride layer 80 can be formed by only one patterning process, thereby simplifying the manufacturing process of the display substrate and reducing the cost.

Of course, the arrangement of the first layer 20 and the second layer 30 in the present disclosure is not limited to the above two manners, and those skilled in the art may make choices according to actual requirements.

Optionally, as shown in FIG. 4 and FIG. 5, in an embodiment of the present disclosure, a gate metal layer 90, a first insulation layer 100 and a source-drain metal layer 110 are further provided in the display area A of the display substrate 1. The first silicon nitride layer 70, the first silicon oxide layer 50, the polysilicon layer 40, the second silicon oxide layer 60, the second silicon nitride layer 80, the gate metal layer 90, the first insulation layer 100, and the source-drain metal layer 110 are sequentially disposed in a direction away from the display substrate 1.

Further as shown in FIG. 4 and FIG. 5, a gate line and a gate electrode G of the thin film transistor are disposed in the gate metal layer 90. A data line, a source electrode S and a drain electrode D of the thin film transistor are disposed are disposed in the source-drain metal layer 110. The source electrode S and the drain electrode D of the thin film transistor are connected to the active layer 41 respectively via through holes passing through the second silicon oxide layer 60, the second silicon nitride layer 80, and the first insulation layer 100. The active layer 41 has a channel region 41a, in order to decrease the contact resistance between the source electrode S and the drain electrode D of the thin film transistor and the active layer 41, the region of the active layer 41 except the channel region 41a may be heavily doped so as to form two ohmic contact regions 41b. One of the two ohmic contact regions 41b is connected to one of the source electrode S and the drain electrode D of the thin film transistor, and the other one of the two ohmic contact regions 41b is connected to the other one of the source electrode S and the drain electrode D of the thin film transistor.

The display area A is provided with the display substrate 1 with the above-mentioned structure, which is applicable for a liquid crystal display panel, an organic light-emitting display panel and a micro light-emitting diode display panel. Based on the above-mentioned structure, in an embodiment, each input end and each output end of the force sensor 10 may be electrically connected to an integrated circuit via a wiring formed in the same layer as the gate metal layer or the source-drain metal layer. Optionally, as shown in FIG. 4 and FIG. 5, each input end and each output end of the force sensor 10 are electrically connected to the integrated circuit via a wiring 111 formed in the same layer as the source-drain metal layer 110.

Figure 6:
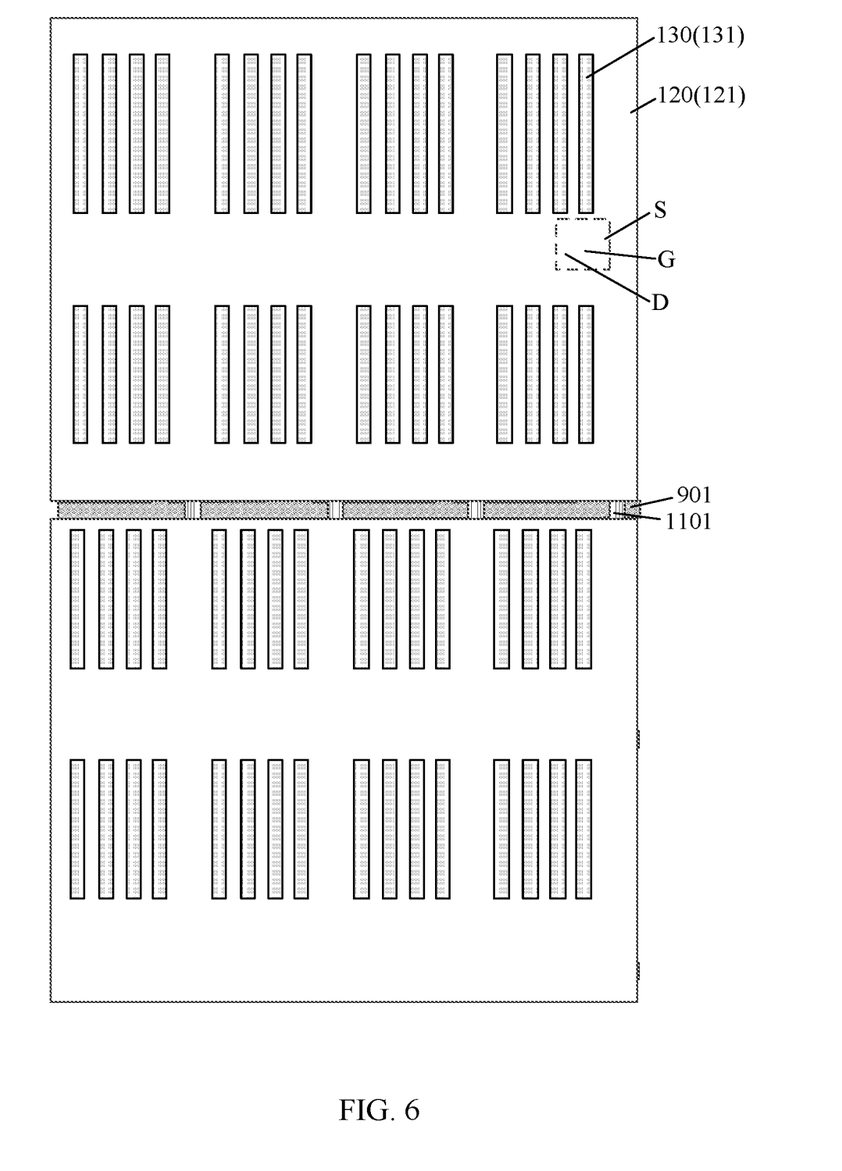
FIG. 6 is a top view of a display area of a display substrate provided by an embodiment of the present disclosure.

In addition, in an embodiment, when the display substrate 1 is an array substrate in a liquid crystal display panel, a common electrode layer and a pixel electrode layer insulated from one another may be further provided in the display area A of the display substrate 1. As shown in FIG. 6, FIG. 6 is a top view of a display area of a display substrate provided by an embodiment of the present disclosure. The common electrode layer 120 is provided with a plurality of common electrode blocks 121, and the common electrode blocks 121 can be multiplexed as touch electrode. The pixel electrode layer 130 is provided with a plurality of pixel electrodes 131, and each pixel electrode 131 is electrically connected to the drain electrode D of the thin film transistor. The source electrode S of the thin film transistor is electrically connected to the data line 1101. The gate electrode G of the thin film transistor is electrically connected to the gate line 901. In this case, a multi-dimensional electric field is formed between the pixel electrode 131 and the common electrode block 121 to control deflection of liquid crystal molecules. It should be noted that, it is only an example in FIG. 6 that, only the pixel electrode layer 130 is located under the common electrode layer 120, and the common electrode 121 is provided with a slit. Of course, it is also possible that the pixel electrode layer 130 is disposed above the common electrode layer 120, and the pixel electrode 131 is provided with a slit, which will not be limited in the present disclosure.

In addition, the inventor of the present disclosure has found that, the thickness of the layer where the force sensor 10 is located affects the performance of the force sensor 10. The thinner the layer where the force sensor 10 is located, the more likely a non-elastic deformation tends to occur at the position of the force sensor 10, and meanwhile the more likely the baseline of the force sensor 10 tends to drift; the thicker the layer where the force sensor 10 is located, the less likely a non-elastic deformation tends to happen at the position of the force sensor 10, and meanwhile the less easily the baseline of the force sensor 10 tends to drift. Therefore, in an embodiment of the present disclosure, the thickness of the force sensor 10 is selected to be larger than the thickness of the force sensor in the related art. For example, the thickness of the force sensor is 45 nm in the related art, and the thickness of the force sensor 10 is 50-75 nm in an embodiment of the present disclosure. It should be noted that, the thickness of the polysilicon layer 40 in the display area A may be equal to the thickness of the layer where the force sensor 10 is located, in this case, the two may be formed by one patterning process, which simplifies the manufacturing method and manufacturing cost of the display substrate 1; and it is also possible that the thickness of the polysilicon layer 40 is independently set according to the requirements of the thin film transistor in the display area A with respect to the active layer included therein, so that the performance of the thin film transistor can be better; which will not be limited by the embodiments of the present disclosure.

Figure 7:
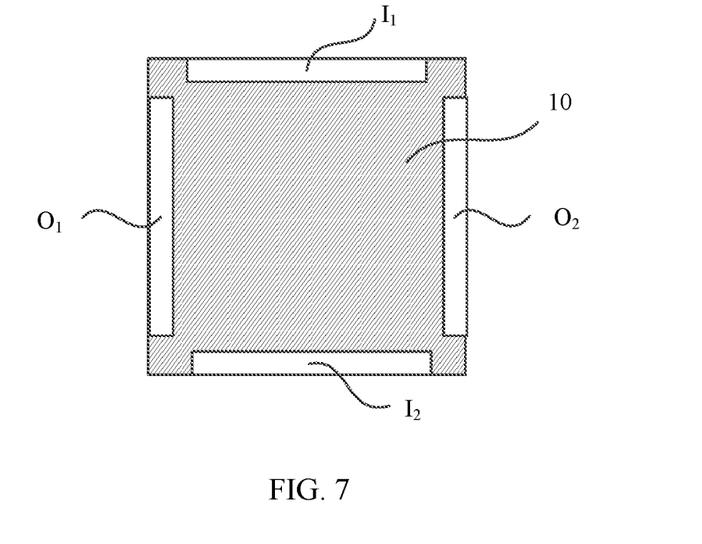
FIG. 7 is a structural schematic diagram of a force sensor provided by an embodiment of the present disclosure.

In addition, as shown in FIG. 7, FIG. 7 is a structural schematic diagram of a force sensor provided by an embodiment of the present disclosure. The force sensor 10 is formed as a one-piece semiconductor structure. Each force sensor 10 includes a first input end $I_1$, a second input end $I_2$, a first output end $O_1$, and a second output end $O_2$. When a shape of the force sensor 10 is rectangular, two opposite sides of the force sensor 10 respectively serve as the first input end $I_1$ and the second input end $I_2$, and the other two opposite sides of the force sensor 10 respectively serve as the first output end $O_1$ and the second output end $O_2$. The first input end $I_1$ and the second input end $I_2$ are used to input a bias voltage signal to the force sensor 10. The first output $O_1$ and the second output $O_2$ are used to output a force-sensitive detection signal from the force sensor 10. Further, a shape of the force sensor 10 may be square.

When the force sensor 10 detects the force applied to the display panel 1, the display panel 1 is deformed under the action of the force so that the force sensor 10 is deformed, then the output signals of the first output end $O_1$ and the second output end $O_2$ are changed. Usually, the magnitude of the force applied to the display panel 1 can be calculated via values of the output signals from the first output end $O_1$ and the second output end $O_2$.

Figure 8:
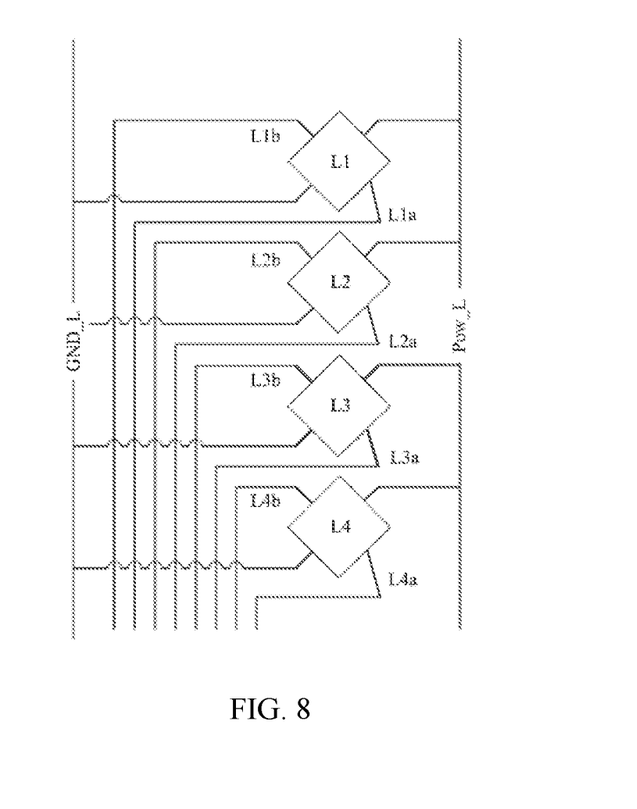
FIG. 8 is a schematic diagram of a connection of force sensors provided by an embodiment of the present disclosure.

In addition, as shown in FIG. 1, four force sensors 10 are evenly arranged at each side of two opposite sides of the peripheral area B of the display panel 1. As shown in FIG. 8, FIG. 8 is a schematic diagram of a connection of force sensors provided by an embodiment of the present disclosure. Four force sensors shown in FIG. 8 are respectively denoted as L1, L2, L3 and L4. The first input ends of the four force sensors 10 are electrically connected to the integrated circuit (not shown in FIG. 8) via the same one wiring (denoted as GND_L in FIG. 8), and the second input ends of the four force sensors 10 are electrically connected to an integrated circuit via the same one wiring (denoted as Pow_L in FIG. 8). The output ends of the four force sensors 10 (ie., L1*a*, L1*b*, L2*a*, L2*b*, L3*a*, L3*b*, L4*a* and L4*b* shown in FIG. 8) are electrically connected to the integrated circuit via respective corresponding wirings. It should be noted that, in the embodiment of the present disclosure, the number of the force sensors 10 evenly arranged at each of the two opposite sides of the peripheral area B of the display panel 1 is not limited to four, and it may also be other numbers, such as three, five and so on.

The present disclosure further provides a display panel, which includes the display substrate described in any one of the above descriptions. It should be noted that, the display panel 1 in the embodiments of the present disclosure may be a liquid crystal display panel, an organic light-emitting display panel, or a micro light-emitting diode display panel, which will not be limited by the present embodiments.

As an example, the display panel 1 is a liquid crystal display panel. The liquid crystal display panel includes an array substrate and a color film substrate disposed opposite to the array substrate. A liquid crystal layer is disposed between the array substrate and the color film substrate. A plurality of gate lines and a plurality of data lines are arranged on the array substrate in a crisscross manner. The plurality of gate lines and the plurality of data lines define a plurality of pixel units, and the plurality of pixel units each are provided with a thin film transistor and a pixel electrode. The gate electrode of the thin film transistor is electrically connected to the gate line, and the source electrode of the thin film transistor is electrically connected to the data line, and the drain electrode of the thin film transistor is electrically connected to the pixel electrode. The color film substrate includes a grid-shaped black matrix and a plurality of color filters disposed in an opening of the black matrix, and the color filters are disposed in an array. The color filters include red color filters, green color filters and blue color filters.

As an example, the display panel 1 is an organic light-emitting display panel. The organic light-emitting display panel includes an array substrate including a plurality of pixel circuits. The organic light-emitting display panel further includes a plurality of organic light-emitting diodes (OLEDs) disposed on the array substrate, and an anode of each organic light-emitting diode is correspondingly electrically connected to the pixel circuit on the array substrate. The plurality of light-emitting diodes include a light-emitting diode for emitting red light, a light-emitting diode for emitting green light, and a light-emitting diode for emitting blue light. In addition, the organic light-emitting display panel further includes a packaging layer covering the plurality of organic light-emitting diodes.

As an example, the display panel 1 is a micro light-emitting diode display panel. The micro light-emitting diode display panel includes an array substrate, and the array substrate includes a plurality of pixel circuits. The micro light-emitting diode display panel further includes a plurality of micro light-emitting diodes (Mic-LEDs) disposed on the array substrate. An anode of each of the Mic-LEDs is correspondingly electrically connected to a pixel circuit on the array substrate. The plurality of Mic-LEDs includes a Mic-LED for emitting red light, a Mic-LED for emitting green light, and a Mic-LED for emitting blue light. The Mic-LEDs may be formed on a growth substrate and subsequently transferred to the array substrate by transferring.

Figure 9:
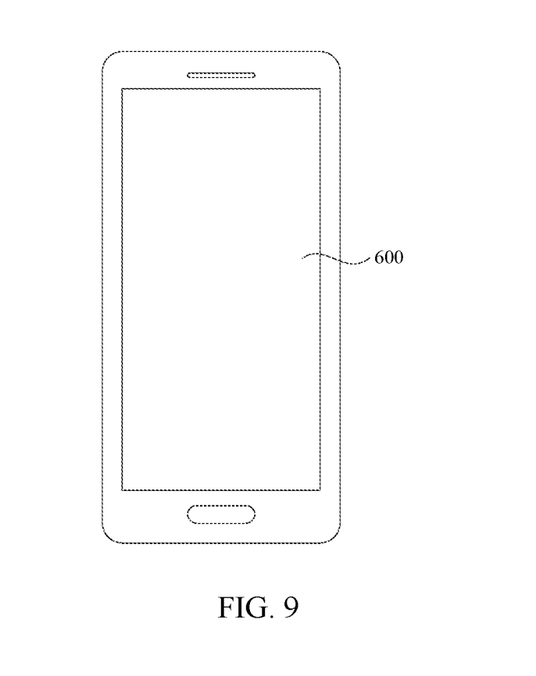
FIG. 9 is a top view of a display device provided by an embodiment of the present disclosure.

The present disclosure further provides a display device. As shown in FIG. 9, FIG. 9 is a top view of a display device provided by an embodiment of the present disclosure. The display device includes the display panel 600 described above. When the display panel is a liquid crystal display panel, the display device further includes a backlight module. The backlight module is disposed at a side of the array substrate (included in the liquid crystal display panel) away from the color film substrate. The backlight module provides light to the display panel. The display device provided in the present disclosure may be any display device that has a display function, such as a smart cellphone, a wearable smart watch, a smart glasses, a tablet computer, a television, a displayer, a notebook computer, a digital photo frame, a navigator, a car monitor, an e-book and the like.

Figure 10:
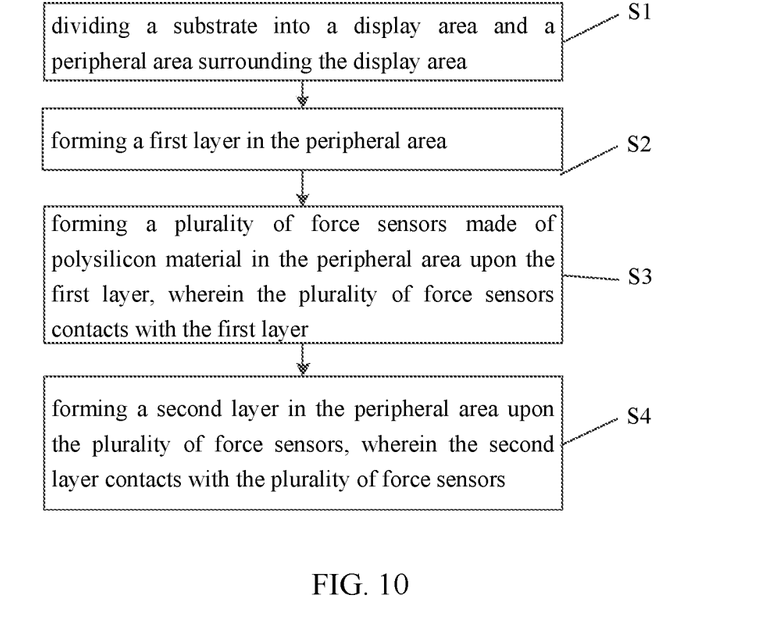
FIG. 10 is a flowchart of a method for manufacturing a display substrate provided by an embodiment of the present disclosure.

The present disclosure further provides a method for manufacturing a display substrate, and the method is used to manufacture the display substrate as shown in FIG. 2. As shown in FIG. 10, FIG. 10 is a flowchart of a method for manufacturing a display substrate provided by an embodiment of the present disclosure. The method for manufacturing the display substrate includes the following steps: step S1: dividing a substrate into a display area and a peripheral area surrounding the display area; step S2: forming a first layer in the peripheral area; step S3: directly forming a plurality of force sensors in the peripheral area where the first layer is formed, the plurality of force sensors being made of polysilicon material, wherein the "directly forming a plurality of force sensors" refers to "forming a plurality of force sensors in direct contact with an upper surface of the first layer"; and step S4: directly forming a second layer in the peripheral area where the plurality of force sensors is formed. Wherein the "directly forming a second layer" refers to "forming a second layer in direct contact with upper surfaces of the plurality of force sensors". A Young's modulus of at least one of the first layer and the second layer is larger than a Young's modulus of silicon oxide.

Optionally, the first layer and the second layer each have Young's modulus which is larger than the Young's modulus of silicon oxide, so that both the first layer and the second layer are difficult to be compressed, which can better prevent the baseline of the force sensor from drifting, thereby better improving detection accuracy of the force sensor. Further, the Young's modulus of silicon nitride is 220 GPa and the display substrate in the related art is provided with a silicon nitride layer, therefore, in an embodiment of the present disclosure, both the first layer and the second layer are made of silicon nitride.

A variety of layers are disposed in the display area A, for example, as shown in FIG. 4 and FIG. 5, a polysilicon layer 40, a first silicon oxide layer 50, a second silicon oxide layer 60, a first silicon nitride layer 70, and a second silicon nitride layer 80 are disposed in the display area A, wherein the first silicon nitride layer 70, the first silicon oxide layer 50, the polysilicon layer 40, the second silicon oxide layer 60, and the second silicon nitride layer 80 are sequentially disposed adjacent to each other along a direction perpendicular to the display substrate. Therefore, in order to form each of the layers in the display area, in an embodiment of the present disclosure, the method for manufacturing the display substrate further includes the following steps.

A first silicon nitride layer is formed in the display area.

A first silicon oxide layer is formed directly in the display area where the first silicon nitride layer is formed.

A polysilicon layer is formed directly in the display area where the first silicon oxide layer is formed.

A second silicon oxide layer is formed directly in the display area where the polysilicon layer is formed.

A second silicon nitride layer is formed directly in the display area where the second silicon oxide layer is formed.

In order to simplify the manufacturing process of the display substrate 1 and reduce the cost, in an embodiment, the polysilicon layer and the plurality of force sensors is formed simultaneously.

It can be known from above that, in the method for manufacturing the display substrate according to the embodiments of the present disclosure, it is required that the first layer made of silicon nitride and the second layer made of silicon nitride are formed in the peripheral area, and it is also required that the first silicon nitride layer and the second silicon nitride layer are formed in the display area. Therefore, in order to simplify the manufacturing process of the display substrate and reduce the cost, the embodiments of the present disclosure provide several specific methods for forming each of the layers.

Figure 11:
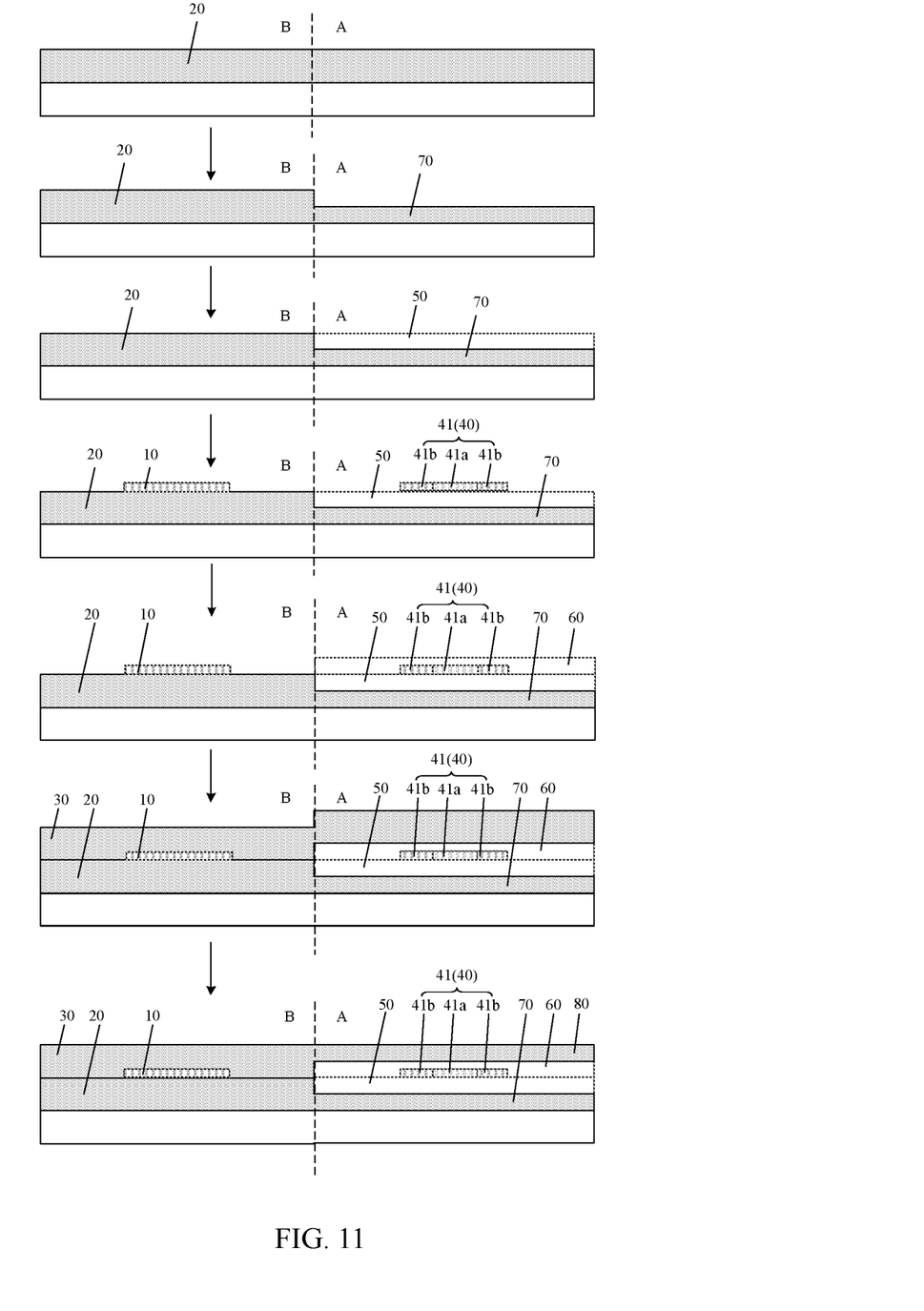
FIG. 11 is schematic diagram I of a manufacturing process of a display substrate provided by an embodiment of the present disclosure.

In a first specific method, as shown in FIG. 11, FIG. 11 is schematic diagram I of a manufacturing process of a display substrate provided by an embodiment of the present disclosure. Forming the first layer 20 in the peripheral area B and forming the first silicon nitride layer 70 in the display area A specifically includes: forming a layer of silicon nitride simultaneously in both the peripheral area B and the display region A of the display substrate, wherein the silicon nitride in the peripheral area B is used as the first layer 20; and etching the silicon nitride in the display area A until a thickness of the silicon nitride is reduced by a thickness of the first silicon oxide layer 50 so as to form the first silicon nitride layer 70.

As shown in FIG. 11, after the first layer 20 is formed in the peripheral area B and the first silicon nitride layer 70 is formed in the display area A, the first silicon oxide layer 50 is formed in the display area A, then a plurality of force sensors 10 is formed in the peripheral area B, and the polysilicon layer 40 is formed in the display area A. The polysilicon layer 40 includes an active layer 41 corresponding to a thin film transistor in the display area A. The active layer 41 includes a channel region 41a and an ohmic contact region 41b. And then the second silicon oxide layer 60 is formed in the display area A.

With further reference to FIG. 11, forming the second layer 30 in the peripheral area B and forming the second silicon nitride layer 80 in the display area A specifically includes: forming a layer of silicon nitride simultaneously in both the peripheral area B and the display area A of the display substrate, wherein the silicon nitride in the peripheral area B is used as the second layer 30; and etching the silicon nitride in the display area A until a thickness of the silicon nitride is reduced by a thickness of the second silicon oxide layer 60 so as to form the second silicon nitride layer 80.

In this case, a total thickness of the first layer 20 and the second layer 30 in the peripheral area B is equal to a total thickness of the first silicon oxide layer 50, the second silicon oxide layer 60, the first silicon nitride layer 70, and the second silicon nitride layer 80 in the display area A, so that the display substrate with each of the above-mentioned layers has a good flatness, which is beneficial to formation of subsequent other layers.

Figure 12:
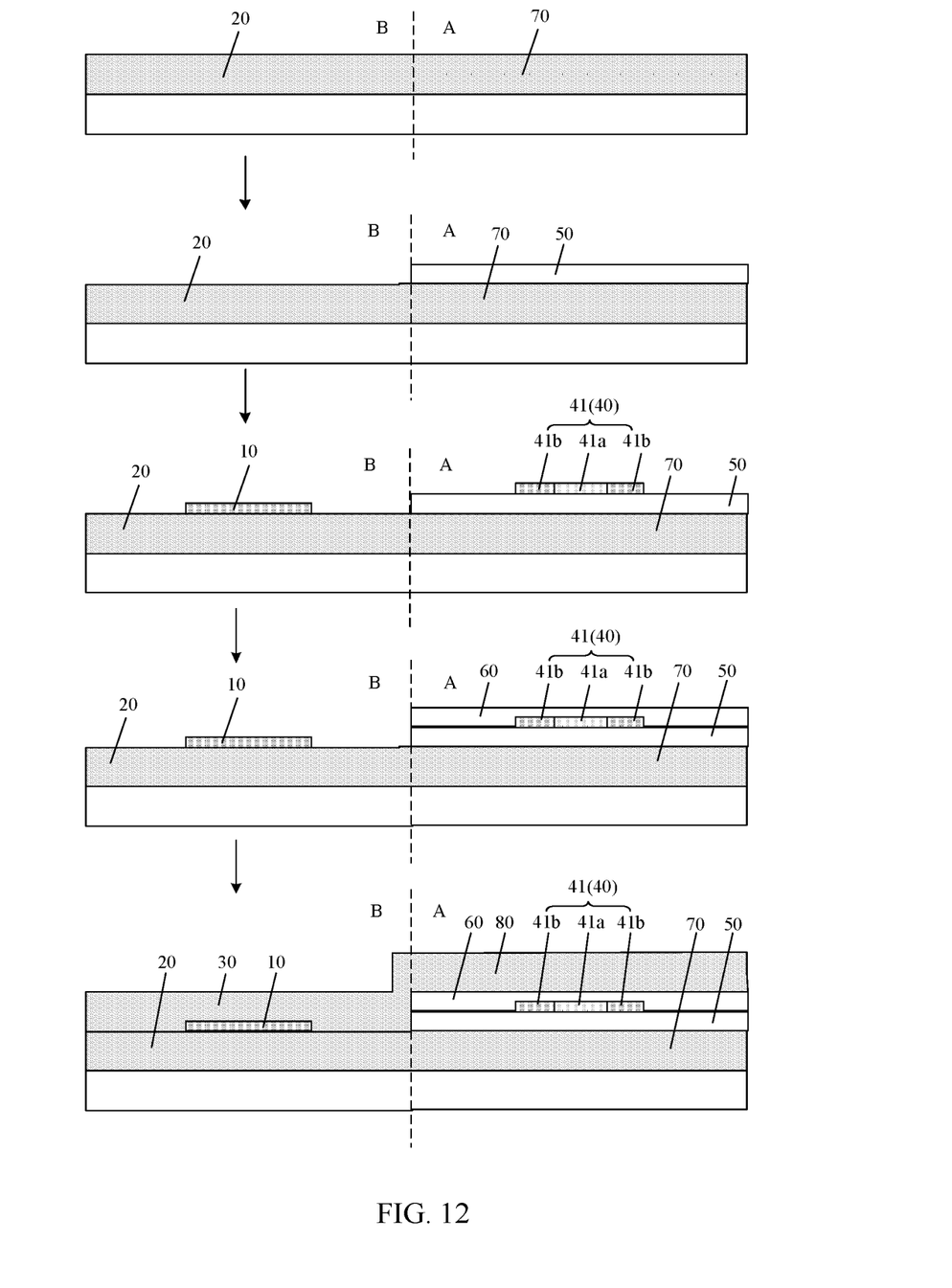
FIG. 12 is schematic diagram II of a manufacturing process of a display substrate provided by an embodiment of the present disclosure.

In a second specific method, as shown in FIG. 12, FIG. 12 is schematic diagram II of a manufacturing process of a display substrate provided by an embodiment of the present disclosure. Forming the first layer 20 in the peripheral area B and forming the first silicon nitride layer 70 in the display area A specifically includes: forming a layer of silicon nitride simultaneously in the peripheral area B and the display area A of the display substrate, wherein the silicon nitride in the peripheral area B is used as the first layer 20 and the silicon nitride in the display area A is used as the first silicon nitride layer 70, a thickness of the first layer 20 is equal to a thickness of the first silicon nitride layer 70.

As shown in FIG. 12, after the first layer 20 is formed in the peripheral area B and the first silicon nitride layer 70 is formed in the display area A, the first silicon oxide layer 50 is formed in the display area A, then a plurality of force sensors 10 is formed in the peripheral area B, and the polysilicon layer 40 is formed in the display area A. The polysilicon layer 40 includes an active layer 41 corresponding to a thin film transistor in the display area A. The active layer 41 includes a channel region 41a and an ohmic contact region 41b. And then the second silicon oxide layer 60 is formed in the display area A.

With further reference to FIG. 12, forming the second layer 30 in the peripheral area B and forming the second silicon nitride layer 80 in the display area A specifically includes: forming a layer of silicon nitride layer simultaneously in both the peripheral area B and the display area A of the display substrate, wherein the silicon nitride in the peripheral area B is used as the second layer 30, and the silicon nitride in the display area A is used as the second silicon nitride layer 80, and a thickness of the second layer 30 is equal to a thickness of the second silicon nitride layer 80.

In this case, the first layer 20 and the first silicon nitride layer 70 can be formed by only one patterning process, and the second layer 30 and second silicon nitride layer 80 can be formed by only one patterning process, thereby simplifying the manufacturing process of the display substrate relatively and reducing the cost.

Obviously, the manufacturing method for the first layer, the second layer, the first silicon nitride layer and the second silicon nitride layer is not limited to the above description, and those skilled in the art can make choices according to actual requirements.

Optionally, a plurality of force sensors made of polysilicon being directly formed in the peripheral area where the first layer is formed specifically includes: directly forming a layer of amorphous silicon in the peripheral area where the first layer is formed; laser crystallizing the amorphous silicon to form a plurality of force sensors made of polysilicon.

Further, in order to make the force sensors to be more electric conductive, the force sensors can be made of heavily doped polysilicon. Correspondingly, the method for manufacturing the display substrate further includes: heavily doping the plurality of force sensors made of polysilicon after forming the second layer.

It should be noted that, specific details about each of the layers in the display substrate are applicable for the above method for manufacturing the display substrate, which will not be further described herein.

The present disclosure provides a display substrate and a manufacturing method thereof, a display panel and a display device. The display substrate includes a display area and a peripheral area surrounding the display area. A plurality of force sensors is provided in the peripheral area, and the plurality of force sensors is made of polysilicon. In a direction perpendicular to the display substrate, a first layer is disposed directly under a layer where the force sensor is located, and a second layer is disposed directly above the layer where the force sensor is located. In the related art, a material of the layers, which are disposed directly above and under the layer where the force sensor is located, is silicon oxide. In an embodiment, Young's modulus of at least one of the first layer and the second layer is larger than Young's modulus of silicon oxide. As a result, compared with in the related art, at least one of the first layer and the second layer is more difficult to be compressed and deformed, and will not easily cause a non-elastic deformation, so that the force sensor has no deformation when the position where the force sensor is located is not subject to a stress, which can effectively prevent the baseline of the force sensor from drifting, thereby improving detection accuracy of the force sensor with respect to the force.

Finally, it should be noted that, the above-mentioned embodiments are merely for illustrating the present disclosure but not intended to provide any limitation. Although the present disclosure has been described in detail with reference to the above-mentioned embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display substrate, having a display area and a peripheral area surrounding the display area, wherein a plurality of force sensors is provided in the peripheral area and the plurality of force sensors is made of polysilicon material, in a direction perpendicular to the display substrate, a first layer is provided directly under a layer where the plurality of force sensors is located, a second layer is provided directly above the layer where the plurality of force sensors is located, and a Young's modulus of at least one of the first layer and the second layer is greater than a Young's modulus of silicon oxide;

wherein a polysilicon layer, a first silicon oxide layer, a second silicon oxide layer, a first silicon nitride layer and a second silicon nitride layer are only provided in the display area, wherein in the direction perpendicular to the display substrate, the first silicon nitride layer, the first silicon oxide layer, the polysilicon layer, the second silicon oxide layer, and the second silicon nitride layer are sequentially disposed adjacent to each other in an order from the first silicon nitride layer to the first silicon oxide layer, then to the polysilicon layer, then to the second silicon oxide layer, and then to the second silicon nitride layer; the layer where the plurality of force sensors is located is a same layer as a layer where the polysilicon layer is located; and the first layer and the first silicon nitride layer are a same layer, and the second layer and the second silicon nitride layer are another same layer.

2. The display substrate according to claim 1, wherein the first layer and the first silicon nitride layer have a same thickness, and the second layer and the second silicon nitride layer have another same thickness.

3. The display substrate according to claim 1, wherein a total thickness of the first silicon nitride layer and the first silicon oxide layer is equal to a thickness of the first layer, and another total thickness of the second silicon nitride layer and the second silicon oxide layer is equal to a thickness of the second layer.

4. The display substrate according to claim 1, wherein at least one of the first layer and the second layer is made of silicon oxynitride material.

5. The display substrate according to claim 1, wherein the plurality of force sensors each has a thickness of 50-75 nm.

6. A display panel comprising a display substrate, wherein the display panel has a display area and a peripheral area surrounding the display area, wherein a plurality of force sensors is provided in the peripheral area and the plurality of force sensors is made of polysilicon material, in a direction perpendicular to the display substrate, a first layer is provided directly under a layer where the plurality of force sensors is located, and a second layer is provided directly above the layer where the plurality of force sensors is located, and a Young's modulus of at least one of the first layer and the second layer is greater than a Young's modulus of silicon oxide;

wherein a polysilicon layer, a first silicon oxide layer, a second silicon oxide layer, a first silicon nitride layer and a second silicon nitride layer are only provided in the display area, wherein in the direction perpendicular to the display substrate, the first silicon nitride layer, the first silicon oxide layer, the polysilicon layer, the second silicon oxide layer, and the second silicon nitride layer are sequentially disposed adjacent to each other in an order from the first silicon nitride layer to the first silicon oxide layer, then to the polysilicon layer, then to the second silicon oxide layer, and then to the second silicon nitride layer; the layer where the plurality of force sensors is located is a same layer as a layer where the polysilicon layer is located; and the first layer and the first silicon nitride layer are a same layer, and the second layer and the second silicon nitride layer are another same layer.

7. A method for manufacturing a display substrate, comprising steps of:

dividing a substrate into a display area and a peripheral area surrounding the display area;

forming a first layer in the peripheral area;

forming a plurality of force sensors made of polysilicon material in the peripheral area upon the first layer, wherein the plurality of force sensors contacts with the first layer; and forming a second layer in the peripheral area upon the plurality of force sensors, wherein the second layer contacts with the plurality of force sensors;

forming a first silicon nitride layer only in the display area;

forming a first silicon oxide layer only in the display area upon the first silicon nitride layer, wherein the first silicon oxide layer contacts with the first silicon nitride layer;

forming a polysilicon layer only in the display area upon the first silicon oxide layer, wherein the polysilicon layer contacts with the first silicon oxide layer;

forming a second silicon oxide layer only in the display area upon the polysilicon layer, wherein the second silicon oxide layer contacts with the polysilicon layer; and forming a second silicon nitride layer only in the display area upon the second silicon oxide layer, wherein the second silicon nitride layer contacts with the second silicon oxide layer, wherein the polysilicon layer and the plurality of force sensors is simultaneously formed;

wherein a Young's modulus of at least one of the first layer and the second layer is greater than a Young's modulus of silicon oxide, the first layer and the first silicon nitride layer are a same layer, and the second layer and the second silicon nitride layer are another same layer.

8. The method according to claim 7, wherein the step of forming the first layer in the peripheral area and the step of forming the first silicon nitride layer in the display area comprise: forming a layer of silicon nitride simultaneously in both the peripheral area and the display area of the display substrate, wherein the silicon nitride in the peripheral area is used as the first layer and the silicon nitride in the display area is used as the first silicon nitride layer, a thickness of the first layer is equal to a thickness of the first silicon nitride layer; and the step of forming the second layer in the peripheral area and the step of forming the second silicon nitride layer in the display area comprise: forming a layer of silicon nitride layer simultaneously in both the peripheral area and the display area of the display substrate, wherein the silicon nitride in the peripheral area is used as the second layer, and the silicon nitride in the display area is used as the second silicon nitride layer, and a thickness of the second layer is equal to a thickness of the second silicon nitride layer.

9. The method according to claim 7, wherein the step of forming the first layer in the peripheral area and the step of forming the first silicon nitride layer in the display area comprise: forming a layer of silicon nitride simultaneously in both the peripheral area and the display area of the display substrate, wherein the silicon nitride in the peripheral area is used as the first layer; and etching the silicon nitride in the display area until a thickness of the silicon nitride is reduced by a thickness of the first silicon oxide layer so as to form the first silicon nitride layer; and the step of forming the second layer in the peripheral area and the step of forming the second silicon nitride layer in the display area comprise: forming a layer of silicon nitride simultaneously in both the peripheral area and the display area of the display substrate, wherein the silicon nitride in the peripheral area is used as the second layer; and etching the silicon nitride in the display area until a thickness of the silicon nitride is reduced by a thickness of the second silicon oxide layer so as to form the second silicon nitride layer.

10. The method according to claim 7, wherein the step of forming a plurality of force sensors made of polysilicon material in the peripheral area upon the first layer comprises steps of: forming a layer of amorphous silicon in the peripheral area upon the first layer, wherein the layer of amorphous silicon contacts with the first layer; laser crystallizing the amorphous silicon to form a plurality of force sensors made of polysilicon material.

11. The method according to claim 10, wherein the method further comprises a step of: heavily doping the plurality of force sensors made of polysilicon material after forming the second layer.

12. The display substrate according to claim 1, wherein both the Young's modulus of the first layer and the Young's modulus of the second layer are larger than the Young's modulus of silicon oxide.

13. The method according to claim 7, wherein both the Young's modulus of the first layer and the Young's modulus of the second layer are larger than the Young's modulus of silicon oxide.

14. The display substrate according to claim 12, wherein both the first layer and the second layer are made of silicon nitride material.

15. The method according to claim 13, wherein the first layer and the second layer are made of silicon nitride material.

* * * * *